(12) United States Patent
Xiao et al.

(10) Patent No.: US 11,152,443 B2
(45) Date of Patent: Oct. 19, 2021

(54) DISPLAY PANEL HAVING A STORAGE CAPACITOR AND METHOD OF FABRICATING SAME

(71) Applicant: SHENZHEN CHINA STAR OPTOELECTRONICS SEMICONDUCTOR DISPLAY TECHNOLOGY CO., LTD., Shenzhen (CN)

(72) Inventors: Hui Xiao, Shenzhen (CN); Jangsoon Im, Shenzhen (CN)

(*) Notice: Subject to any disclaimer, the term of this patent is extended or adjusted under 35 U.S.C. 154(b) by 378 days.

(21) Appl. No.: 16/326,718

(22) PCT Filed: Nov. 1, 2018

(86) PCT No.: PCT/CN2018/113274
§ 371 (c)(1),
(2) Date: Feb. 20, 2019

(87) PCT Pub. No.: WO2020/047978
PCT Pub. Date: Mar. 12, 2020

(65) Prior Publication Data
US 2021/0183977 A1    Jun. 17, 2021

(30) Foreign Application Priority Data
Sep. 3, 2018 (CN) .......................... 201811019500.4

(51) Int. Cl.
*H01L 29/12* (2006.01)
*H01L 27/32* (2006.01)
*H01L 49/02* (2006.01)
*H01L 51/56* (2006.01)

(52) U.S. Cl.
CPC ...... *H01L 27/3265* (2013.01); *H01L 27/3272* (2013.01); *H01L 28/60* (2013.01); *H01L 51/56* (2013.01); *H01L 2227/323* (2013.01)

(58) Field of Classification Search
CPC . H01L 27/3265; H01L 27/3272; H01L 51/56; H01L 2227/323
See application file for complete search history.

(56) References Cited

U.S. PATENT DOCUMENTS

| | | |
|---|---|---|
| 2013/0334524 A1 | 12/2013 | Miyake et al. |
| 2015/0097172 A1 | 4/2015 | Han et al. |
| 2015/0144910 A1 | 5/2015 | Beak et al. |
| 2017/0077202 A1* | 3/2017 | Ha ....................... H01L 27/1255 |
| 2018/0097184 A1* | 4/2018 | Lee ..................... C07D 405/12 |
| 2018/0122883 A1* | 5/2018 | Beak .................... H01L 27/3248 |
| 2018/0365471 A1* | 12/2018 | Xin ........................ G06K 9/001 |
| 2019/0123121 A1 | 4/2019 | Liu et al. |

FOREIGN PATENT DOCUMENTS

| | | |
|---|---|---|
| CN | 103515395 A | 1/2014 |
| CN | 104517996 A | 4/2015 |
| CN | 104681566 A | 6/2015 |
| CN | 107808895 A | 3/2018 |

* cited by examiner

*Primary Examiner* — Phuc T Dang

(57) ABSTRACT

A display panel and a method of fabricating the same are provided. The display panel has an array substrate having a substrate, a thin film transistor unit and a storage capacitor disposed on the substrate; a light emitting device layer disposed on the array substrate. An orthographic projection of the storage capacitor projected on the light emitting device layer is located within the light emitting device layer.

6 Claims, 5 Drawing Sheets

DISPLAY PANEL HAVING A STORAGE CAPACITOR AND METHOD OF FABRICATING SAME

FIELD OF DISCLOSURE

The present disclosure relates to displays, and more particularly to a display panel and a method of fabricating the same.

BACKGROUND OF DISCLOSURE

In flat panel display technologies, organic light-emitting diode (OLED) displays have many advantages, such as being light weight, thin, active emitting, fast responding rates, wide viewing angles, wide color gamut, high brightness, low power consumption, etc, and have gradually become a third generation display technology after liquid crystal displays.

With development of the display panel, for bottom-emitting OLED display panels, existence of the switching units, thin film transistor units, and storage capacitors in array substrates lead to aperture ratio limitations in pixel units, which can not meet current high-resolution display panels requirements.

Therefore, a display panel is required to solve the above problems.

SUMMARY OF DISCLOSURE

The present disclosure provides a display panel and a method of fabricating the same so as to solve a technical problem that an aperture ratio of the conventional display panel is relatively low.

In order to solve the above problem, the technical solutions provided by the present disclosure are as follows:

The present disclosure provides a display panel comprising:
an array substrate comprising:
  a substrate; and
  a thin film transistor unit and a storage capacitor disposed on the substrate; and
a light emitting device layer disposed on the array substrate,
wherein an orthographic projection of the storage capacitor projected on the light emitting device layer is located within the light emitting device layer.

In an display panel of the present disclosure, the storage capacitor comprises:
a first electrode disposed on the substrate;
a first insulating layer disposed on the first electrode; and
a second electrode disposed on the first insulating layer, wherein the first electrode and the second electrode are made of a transparent metal material.

In an display panel of the present disclosure, the first insulating layer comprises $Al_2O_3$.

In an display panel of the present disclosure, the thin film transistor unit comprises:
a light shielding layer disposed on the substrate;
a buffering layer disposed on the light shielding layer;
an active layer disposed on the buffering layer;
a gate insulating layer disposed on the active layer;
a gate electrode layer disposed on the gate insulating layer;
an insulating interlayer disposed on the gate electrode layer;
a source/drain electrode layer disposed on the insulating interlayer;
a passivation layer disposed on the source/drain electrode layer;
a planarization layer disposed on the passivation layer; and
a pixel electrode layer disposed on the planarization layer,
wherein the first electrode and the active layer are disposed in a same level;
wherein the first insulating layer and the insulating interlayer are disposed in a same level; and
wherein the second electrode and the source/drain electrode layer are formed in a same mask process, or the second electrode and the pixel electrode layer are formed in a same mask process.

In an display panel of the present disclosure, the storage capacitor further comprises a third electrode, and the third electrode is made of a transparent material, wherein:
when the second electrode and the source/drain electrode layer are disposed in a same level, the third electrode and the gate electrode layer are disposed in a same level; and
when the second electrode and the pixel electrode layer are disposed in a same level, the third electrode and the gate electrode layer are disposed in a same level, or the third electrode and the source/drain electrode layer are disposed in a same level.

The present disclosure further provides a method of fabricating a display panel, comprising:
providing a substrate;
forming a thin film transistor unit and a storage capacitor on the substrate;
forming a light emitting device layer on the thin film transistor unit and the storage capacitor, wherein an orthographic projection of the storage capacitor projected on the light emitting device layer is located within the light emitting device layer.

In a fabricating method of the present disclosure, the storage capacitor comprises:
a first electrode disposed on the substrate;
a first insulating layer disposed on the first electrode; and
a second electrode disposed on the first insulating layer, wherein the first electrode and the second electrode are made of a transparent metal material.

In a fabricating method of the present disclosure, the first insulating layer comprises $Al_2O_3$.

In a fabricating method of the present disclosure, the thin film transistor unit comprises:
a light shielding layer disposed on the substrate;
a buffering layer disposed on the light shielding layer;
an active layer disposed on the buffering layer;
a gate insulating layer disposed on the active layer;
a gate electrode layer disposed on the gate insulating layer;
an insulating interlayer disposed on the gate electrode layer;
a source/drain electrode layer disposed on the insulating interlayer;
a passivation layer disposed on the source/drain electrode layer;
a planarization layer disposed on the passivation layer; and
a pixel electrode layer disposed on the planarization layer,
wherein the first electrode and the active layer are disposed in a same level;
wherein the first insulating layer and the insulating interlayer are disposed in a same level; and wherein the second electrode and the source/drain electrode layer are formed in a same mask process, or the second electrode and the pixel electrode layer are formed in a same mask process.

In a fabricating method of the present disclosure, the storage capacitor further comprises a third electrode, and the third electrode is made of a transparent material, wherein:

when the second electrode and the source/drain electrode layer are disposed in a same level, the third electrode and the gate electrode layer are disposed in a same level; and when the second electrode and the pixel electrode layer are disposed in a same level, the third electrode and the gate electrode layer are disposed in a same level, or the third electrode and the source/drain electrode layer are disposed in a same level.

The present disclosure further provides a display panel comprising:

an array substrate comprising:
  a substrate; and
  a thin film transistor unit and a storage capacitor disposed on the substrate; and
a light emitting device layer disposed on the array substrate,
wherein an orthographic projection of the storage capacitor projected on the light emitting device layer is located within the light emitting device layer; and
wherein the storage capacitor comprises:
  a first electrode disposed on the substrate;
  a first insulating layer disposed on the first electrode; and
  a second electrode disposed on the first insulating layer, wherein the first electrode and the second electrode are made of a transparent metal material.

In an display panel of the present disclosure, the first insulating layer comprises $Al_2O_3$.

In an display panel of the present disclosure, the thin film transistor unit comprises:

a light shielding layer disposed on the substrate;
a buffering layer disposed on the light shielding layer;
an active layer disposed on the buffering layer;
a gate insulating layer disposed on the active layer;
a gate electrode layer disposed on the gate insulating layer;
an insulating interlayer disposed on the gate electrode layer;
a source/drain electrode layer disposed on the insulating interlayer;
a passivation layer disposed on the source/drain electrode layer;
a planarization layer disposed on the passivation layer; and
a pixel electrode layer disposed on the planarization layer,
wherein the first electrode and the active layer are disposed in a same level;
wherein the first insulating layer and the insulating interlayer are disposed in a same level; and
wherein the second electrode and the source/drain electrode layer are formed in a same mask process, or the second electrode and the pixel electrode layer are formed in a same mask process.

In an display panel of the present disclosure, the storage capacitor further comprises a third electrode, and the third electrode is made of a transparent material, wherein:

when the second electrode and the source/drain electrode layer are disposed in a same level, the third electrode and the gate electrode layer are disposed in a same level; and when the second electrode and the pixel electrode layer are disposed in a same level, the third electrode and the gate electrode layer are disposed in a same level, or the third electrode and the source/drain electrode layer are disposed in a same level.

Beneficial effects: in the present disclosure, a storage capacitor region of the array substrate is fabricated using a transparent metal material, and the light emitting device layer is disposed on the storage capacitor, so as to improve an aperture ratio of the display panel and improve a display effect of the display panel.

DESCRIPTION OF DRAWINGS

In order to more clearly describe embodiments of the present disclosure or technical solutions in a conventional technology, drawings required to be used for the embodiments or descriptions of the conventional technology are simply described hereinafter. Apparently, the drawings described below only illustrate some embodiments of the present disclosure. Those skilled in the art can obtain other drawings based on these drawings disclosed herein without creative effort.

DETAILED DESCRIPTION OF PREFERRED EMBODIMENTS

The following description of each of the embodiments with reference to the appended drawings is used for illustrating specific embodiments which may be used for carrying out the present disclosure. The directional terms described by the present disclosure, such as "upper", "lower", "front", "back", "left", "right", "inner", "outer", "side", etc., are only directions by referring to the accompanying drawings. Thus, the used directional terms are used to describe and understand the present disclosure, but the present disclosure is not limited thereto. In figures, elements with similar structures are indicated by the same numbers.

Figure 1:
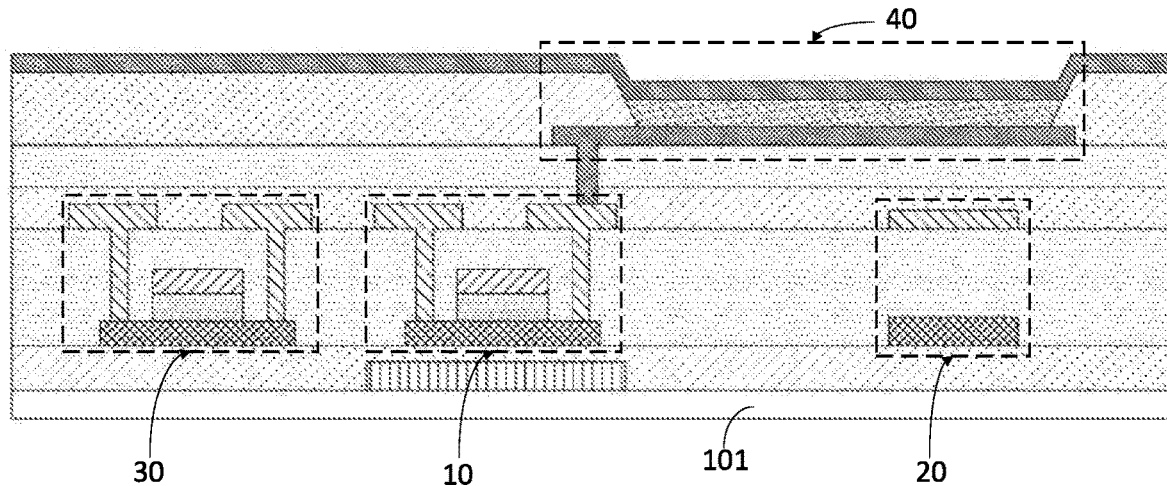
FIG. 1 is a structural diagram of film layers of a display panel of the present disclosure.

FIG. 1 shows a structural diagram of film layers of a display panel of the disclosure. The display panel includes an array substrate. The array substrate includes a substrate 101, a thin film transistor layer disposed on the substrate 101, and a light emitting device layer 40 disposed on the thin film transistor layer. The thin film transistor layer includes a thin film transistor unit 10, a storage capacitor 20, and a switching unit 30, where an orthographic projection of the storage capacitor 20 projected on the light emitting device layer 40 is located within the light emitting device layer 40.

In the present embodiment, the switching unit 30 in FIG. 1 is not specifically introduced.

Figure 2:
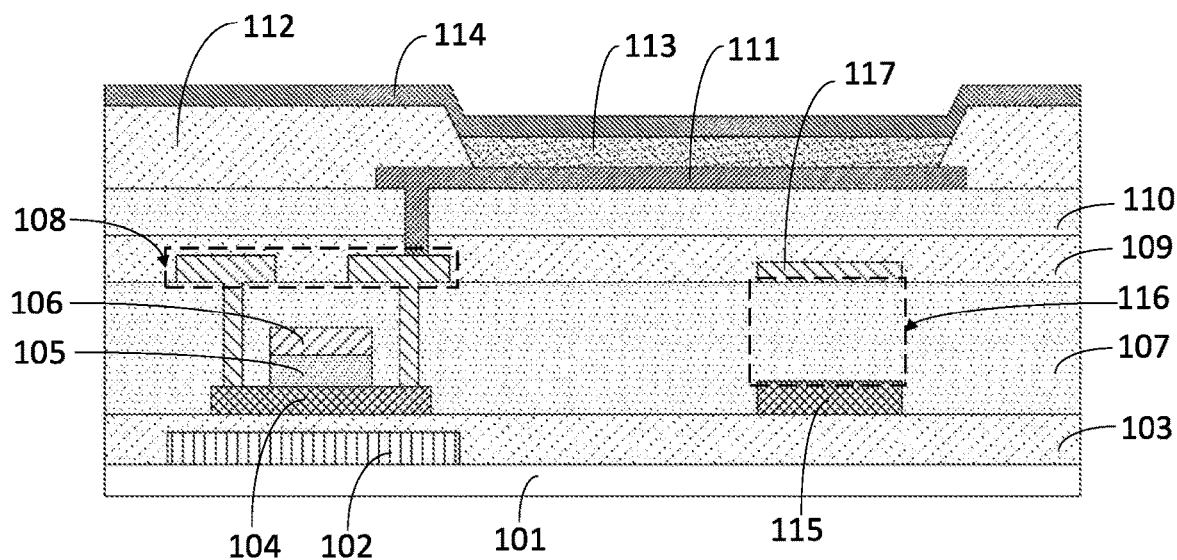
FIG. 2 is a structural diagram of film layers of a display panel of embodiment 1 of the present disclosure.

As shown in FIG. 2, original material of the substrate 101 can be one of a glass substrate, a quartz substrate, a resin substrate, and the like. Further, when the array substrate is a flexible substrate, material of the array substrate can optionally be an organic polymer. In one embodiment, the flexible material can be a polyimide thin film.

The thin film transistor unit 10 includes an etch step layer (ESL) type structure, a back channel etch type (BCE) structure, or a top gate thin film transistor type (top-gate) structure, which is not particularly limited. For example, the top gate thin film transistor type includes a light shielding layer 102, a buffering layer 103, an active layer 104, a gate insulating layer 105, a gate electrode layer 106, an insulating interlayer 107, a source/drain layer 108, a passivation layer 109, and planarization layer.

The light shielding layer 102 is formed on the substrate 101, which is mainly used to shield light from entering the thin film transistor unit 10 so as to affect a driving effect of thin film transistor.

The buffering layer 103 is formed on the light shielding layer 102, which is mainly used to buffer stress between thin film structures and also have a certain effect of blocking water and oxygen.

The active layer 104 is formed on the buffering layer 103. The active layer 104 includes doped regions formed by ion doping (not shown). The active layer is made of indium gallium zinc oxide (IGZO), i.e., a conductive semiconductor, and is also a transparent material.

The gate insulating layer 105 is formed on the active layer 104. In one embodiment, the insulating interlayer 107 covers the active layer 104. The insulating interlayer 107 is used to separate the active layer 104 from other metal layers.

The gate electrode layer 106 is formed on the gate insulating layer 105. Metal material of the gate electrode layer 105 can be generally metals such as molybdenum, aluminum, an aluminum-nickel alloy, a molybdenum-tungsten alloy, chromium, or copper, or a combination of several metal materials described above. In an embodiment, the metal material of the gate layer 106 can be molybdenum.

The insulating interlayer 107 is formed on the gate electrode layer 106. In one embodiment, the insulating interlayer 107 covers the gate electrode layer 106. The gate insulating layer 105 is used to separate the gate electrode layer 106 from the source/drain electrode layer 108.

The source/drain electrode layer 108 is formed on the insulating interlayer 107. Metal material of the source/drain electrode layer 108 can be generally metals such as molybdenum, aluminum, an aluminum-nickel alloy, a molybdenum-tungsten alloy, chromium, copper, a titanium aluminum alloy, or a combination of several metal materials described above. The source/drain electrode layer 108 are electrically connected to the doped regions on the active layer 104 through via holes.

The passivation layer 109 and the planarization layer 110 are formed on the source/drain electrode layer 108. The passivation layer 109 is used to ensure flatness of the process of the thin film transistor.

The light emitting device layer includes a pixel electrode layer 111 (i.e., an anode layer 111), a light emitting layer 112, and a cathode layer 113 formed on the array substrate.

The pixel electrode layer 111 is formed on the planarization layer 110. The pixel electrode layer 111 is mainly used to provide holes for absorbing electrons.

In one embodiment, the light emitting device (OLED) is a bottom emission type OLED device, and thus the pixel electrode layer 111 is a transparent metal electrode.

In one embodiment, material of the anode layer 111 can be selected from at least one of indium tin oxide (ITO), indium zinc oxide (IZO), zinc oxide (ZnO), indium oxide ($In_2O_3$), indium gallium oxide (IGO), or aluminum zinc oxide (AZO).

The light emitting layer 112 is formed on the anode layer 111, and the light emitting layer 112 is divided into a plurality of light emitting units by the pixel defining layer 114, and each of the light emitting units corresponds to one of the anodes. The holes generated by the anode layer 111 absorb electrons generated by the cathode layer 113, and a light source is generated in the light emitting layer 112.

The cathode layer 113 is formed on the light emitting layer 112. The cathode layer 113 covers the light emitting layer 112 and the pixel defining layer 112 on the array substrate. In one embodiment, the cathode layer 113 is a non-transparent material, and light generated by the light emitting layer 112 is projected through the cathode layer 113 toward the substrate 101.

As shown in FIG. 2, the storage capacitor 20 includes a first electrode 115 disposed on the substrate 101, a first insulating layer 116 disposed on the first electrode 115, and a second electrode 117 disposed on the first insulating layer 116.

In one embodiment, the first electrode 115 and the active layer 104 are disposed in a same level, i.e., the first electrode 115 and the active layer 104 are formed in a same mask process. Since the first electrode 115 and the active layer 104 are made of the same material, the first electrode 115 in this embodiment is a transparent electrode. Similarly, the first insulating layer 116 and the interlayer insulating layer 107 are disposed in a same level.

As shown in FIG. 2, the second electrode 117 and the source/drain electrode layer 108 are disposed in a same level. In the embodiment, the source/drain electrode layer 108 and the second electrode 117 are made of a transparent metal material. Alternatively, the source/drain electrode layer 108 and the second electrode 117 are fabricated by two processes, which are a transparent metal material and a non-transparent metal material, respectively.

Figure 3:
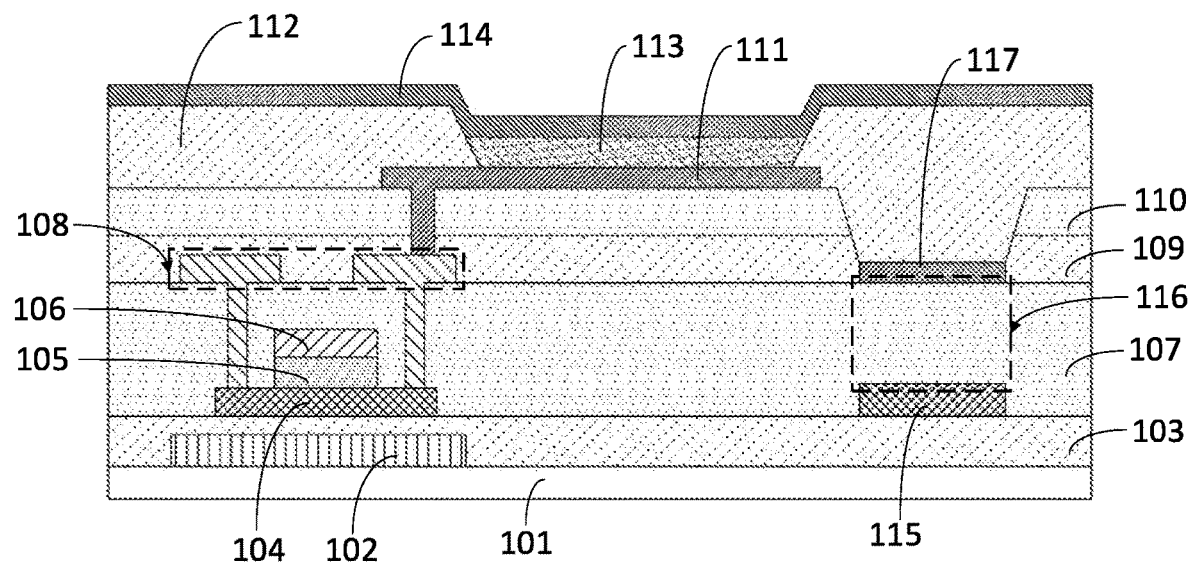
FIG. 3 is a structural diagram of film layers of a display panel of embodiment 2 of the present disclosure.

As shown in FIG. 3, the second electrode 117 and the pixel electrode layer 111 can be disposed in a same level.

Referring to FIG. 2 and FIG. 3, the first insulating layer 116 is used as a etch stop layer to cover the first electrode 115, so as to prevent the second electrode 117 from being damaged by a following etching process. In one embodiment, the first insulating layer 113 comprises $Al_2O_3$.

In an embodiment, material of the insulating interlayer 107 can be aluminum oxide ($Al_2O_3$). The high compactness of the aluminum oxide preferably prevents the active layer 104, the gate insulating layer 105, and the gate electrode layer 106 from being destroyed during etching. In addition, the aluminum oxide has a high electrostatic force constant (K). When an area and a pitch of the two electrode plates are constant, the electrostatic force constant is improved, and the total amount of the storage capacitor 20 is improved.

In one embodiment, the storage capacitor 20 further comprises a third electrode 118.

When the second electrode 117 and the source/drain electrode layer 108 are disposed in a same level, the third electrode 118 and the gate electrode layer 106 are disposed in a same level. When the second electrode 117 and the pixel electrode layer 111 are disposed in a same level, the third electrode 118 and the gate electrode layer 106 are disposed in a same level, or the third electrode 118 and the source/drain electrode layer 108 are disposed in a same level.

Figure 4:
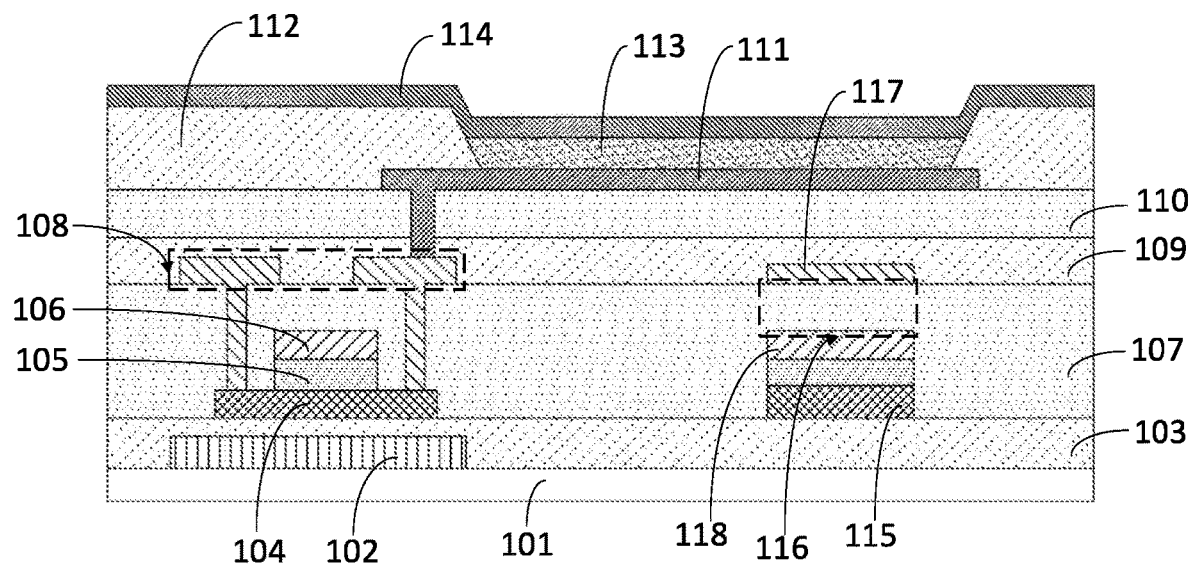
FIG. 4 is a structural diagram of film layers of a display panel of embodiment 3 of the present disclosure.

As shown in FIG. 4, when the second electrode 117 and the source/drain electrode layer 108 are disposed in a same level, the third electrode 118 and the gate electrode layer 106 are disposed in a same level. Compared with FIG. 2 or FIG. 3, three parallel connected capacitors increase a total charge of the storage capacitor 20.

In one embodiment, the first electrode 115, the second electrode 117, or the third electrode 118 forms the storage capacitor 20, and the first electrode 115, the second electrode 117, and the third electrode 118 are transparent electrodes. An orthographic projection of the first electrode 115, the second electrode 117 or the third electrode 118 projected on the light emitting device layer 40 is located within the light emitting device layer 40. Under the requirement of high-resolution panel for high capacitance, the transparent setting of the storage capacitor improves an aperture ratio of the display panel and improves the display effect of the display panel.

Figure 5:
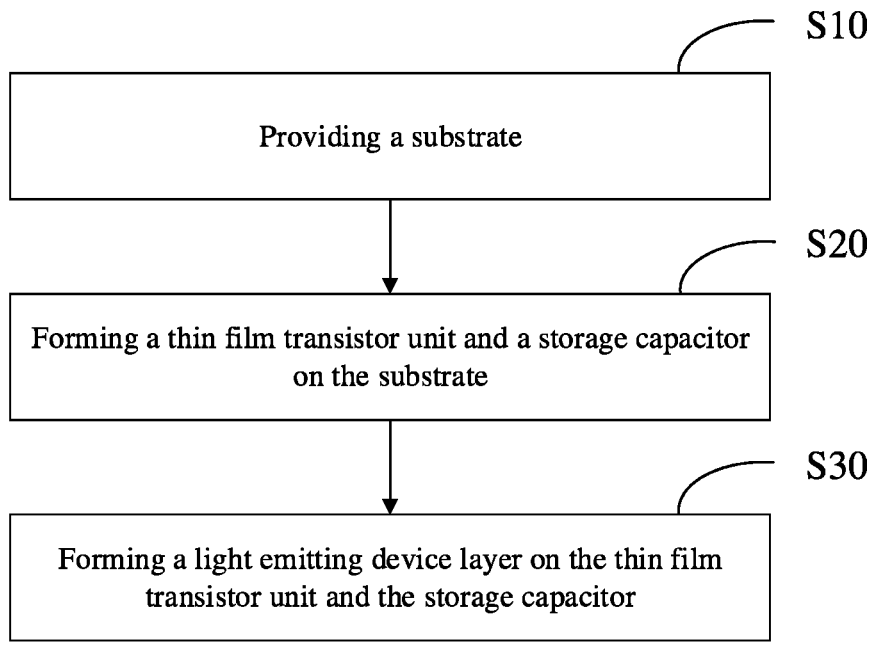
FIG. 5 is a flow chart of a method of fabricating a display panel of the present disclosure.

FIG. 5 shows a method of fabricating a display panel of the present disclosure, which includes:

Step S10: providing a substrate:

In the present embodiment, original material of the substrate 201 can be one of a glass substrate, a quartz substrate, a resin substrate, and the like. Further, when the array substrate is a flexible substrate, material of the array substrate can optionally be an organic polymer. In one embodiment, the flexible material can be a polyimide thin film.

Step S20: forming a thin film transistor unit and a storage capacitor on the substrate:

In the present step, the thin film transistor unit, the storage capacitor, and the switching unit of the display panel are simultaneously formed on the substrate 201. The switching unit in one embodiment is not specifically introduced.

Figure 6:
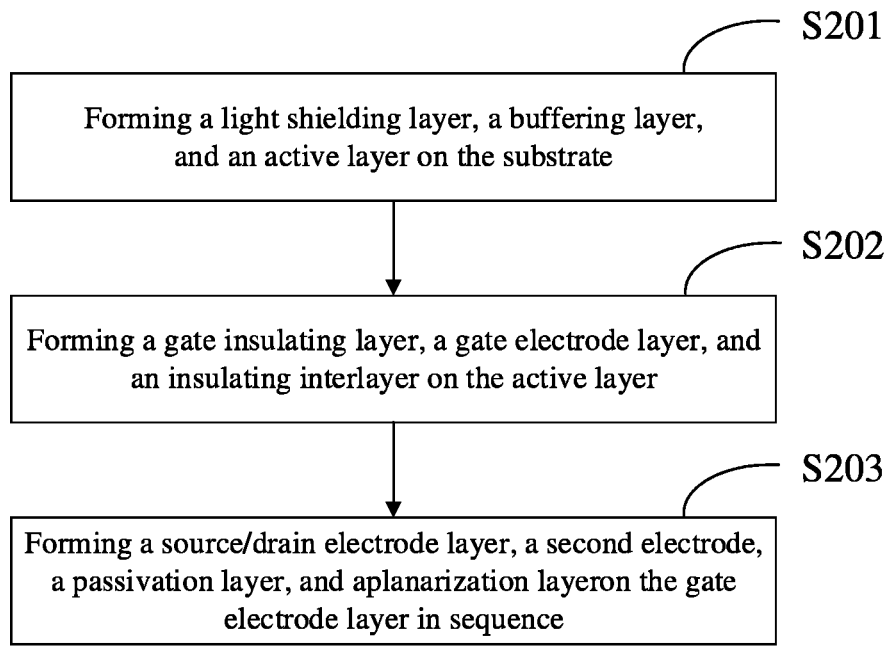
FIG. 6 is another flow chart of a method of fabricating a display panel of the present disclosure.
Figure 7A:
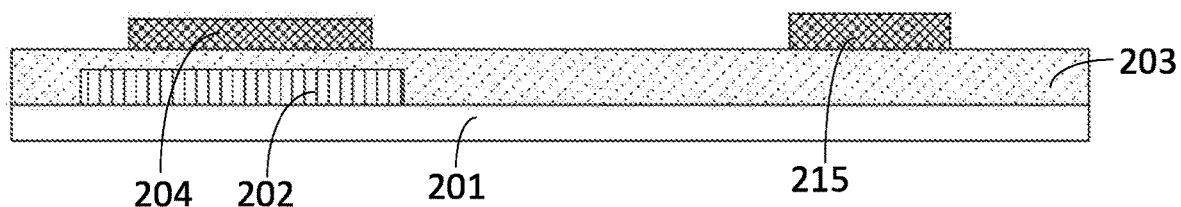
FIGS. 7A-7D are flow charts of a method of fabricating a display panel of the present disclosure.

As shown in FIG. 6, steps are specifically included:

Step S201: forming a light shielding layer, a buffering layer, and an active layer on the substrate:

As shown in FIG. 7A, a first metal layer is deposited on the substrate 201 and is patterned to form a light shielding layer 202 of the thin film transistor unit and a first electrode 210 of the storage capacitor.

In one embodiment, metal material of the first metal layer can be molybdenum.

The buffering layer 203 covers the light shielding layer 202. The buffering layer 203 is mainly used to buffer stress between thin film structures and also have a certain effect of blocking water and oxygen.

First, an active layer thin film is formed on the buffering layer 203, and the active layer thin film is made of polysilicon. After using a first mask process on the active layer thin film, forming a first photoresist layer (not shown) on the active layer thin film, exposing with a mask (not shown), developing, and a first etching pattern processing, the active layer thin film forms the active layer 204 and the first electrode 215 as shown in FIG. 7A, and the first photoresist layer is peeled off.

The first electrode 215 and the active layer 204 are disposed in a same level. The active layer 204 is made of indium gallium zinc oxide (IGZO), i.e., a conductive semiconductor, and is also a transparent material.

Step S202: forming a gate insulating layer, a gate electrode layer, and an insulating interlayer on the active layer:

In the present step, a gate insulating layer 205 and a second metal layer are formed on the active layer 204 in sequence. Metal material of the second metal layer can be generally metals such as molybdenum, aluminum, an aluminum-nickel alloy, a molybdenum-tungsten alloy, chromium, or copper, or a combination of several metal materials described above. In an embodiment, the metal material of the second metal layer can be molybdenum.

Figure 7B:
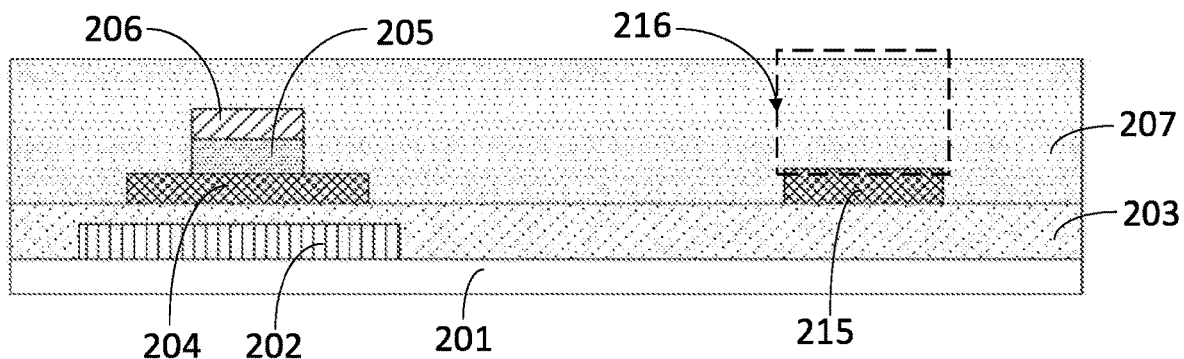

After using a second mask process for the gate electrode layer, forming a second photoresist layer on the second metal layer, using a mask for shown) for exposing, developing, and a second etching pattern processing, the gate electrode layer and the gate insulating layer are formed in a pattern as shown in FIG. 7B, and the second photoresist layer is peeled off.

The gate insulating layer 205 and the gate electrode layer 206 can be formed in a mask process, that is, the pattern shown in FIG. 7B is formed.

An insulating interlayer 207 is deposited to separate the gate electrode layer 206 from the source/drain electrode layer 208. In one embodiment, the insulating interlayer 207 is made of $Al_2O_3$.

The first insulating layer 216 and the insulating interlayer 207 are disposed in a same level, i.e., the first insulating layer 216 is also made of aluminum oxide ($Al_2O_3$). The high compactness of the aluminum oxide preferably prevents the active layer 204, the gate insulating layer 205, and the gate electrode layer 206 from being destroyed during etching. In addition, the aluminum oxide has a high electrostatic force constant (K). When an area and a pitch of the two electrode plates are constant, the electrostatic force constant is improved, and the total amount of the storage capacitor 20 is improved.

Figure 7C:
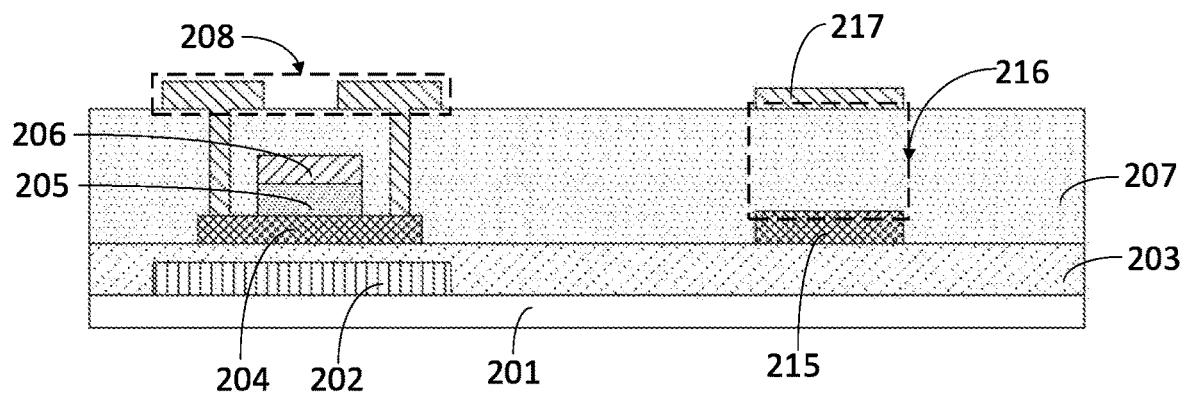

Step S203: forming a source/drain electrode layer, a second electrode, a passivation layer, and a planarization layer on the gate electrode layer in sequence:

As shown in FIG. 7C, the source/drain electrode layer 208 is formed on the insulating interlayer 207. Metal material of the source/drain electrode layer 208 can be generally metals such as molybdenum, aluminum, an aluminum-nickel alloy, a molybdenum-tungsten alloy, chromium, copper, a titanium aluminum alloy, or a combination of several metal materials described above. The source/drain electrode layer 208 are electrically connected to the doped regions on the active layer 204 through via holes.

The second electrode 217 of the storage capacitor 20 is simultaneously formed when the source/drain electrode layer 208 is formed. In one embodiment, the second electrode 217 and the source/drain electrode layer 208 are transparent metals. Alternatively, the source/drain electrode layer 208 and the second electrode 217 are fabricated by two processes, which are a transparent metal material and a non-transparent metal material, respectively.

The passivation layer 209 and the planarization layer 210 are formed on the source/drain electrode layer 208. The passivation layer 209 and the planarization layer 210 are used to ensure flatness of the process of the thin film transistor.

Step S30: forming an organic light emitting layer on the thin film transistor unit and the storage capacitor:

The light emitting device layer 40 includes a pixel electrode layer 211 (i.e., an anode layer 111), a light emitting layer 212, and a cathode layer 213 formed on the array substrate.

The pixel electrode layer 211 is formed on the planarization layer 210. The pixel electrode layer 211 is mainly used to provide holes for absorbing electrons. In one embodiment, the light emitting device (OLED) is a bottom emission type OLED device, and thus the pixel electrode layer 211 is a transparent metal electrode.

In one embodiment, material of the anode layer 211 can be selected from at least one of indium tin oxide (ITO), indium zinc oxide (IZO), zinc oxide (ZnO), indium oxide ($In_2O_3$), indium gallium oxide (IGO), or aluminum zinc oxide (AZO).

The light emitting layer 212 is formed on the anode layer 211, and the light emitting layer 212 is divided into a plurality of light emitting units by the pixel defining layer 214, and each of the light emitting units corresponds to one of the anodes. The holes generated by the anode layer 211 absorb electrons generated by the cathode layer 213, and a light source is generated in the light emitting layer 212.

The cathode layer 213 is formed on the light emitting layer 212. The cathode layer 213 covers the light emitting layer 212 and the pixel defining layer 212 on the array substrate. In one embodiment, the cathode layer 213 is a non-transparent material, and light generated by the light emitting layer 212 is projected through the cathode layer 213 toward the substrate 201.

In one embodiment, the light emitting device layer 10 covers the storage capacitor 20, i.e., an orthographic projection of the first electrode 215 and the second electrode 117 projected on the light emitting device layer 40 is located within the light emitting device layer 40.

Figure 7D:
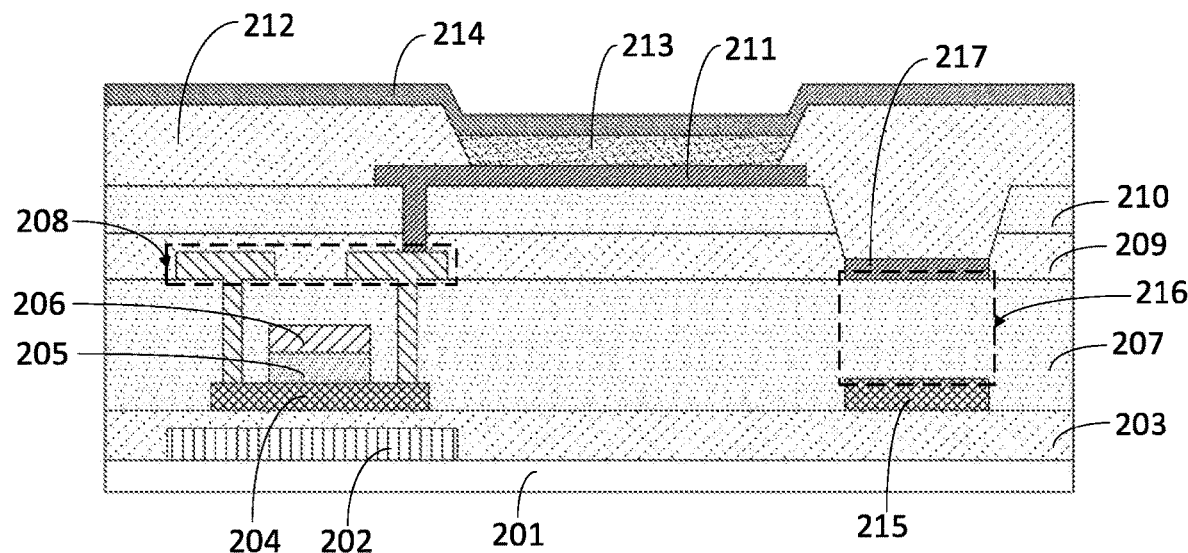

As shown in FIG. 7D, the second electrode 217 and the pixel electrode layer 211 can be formed in a same mask process. Although the storage capacitor 20 is not covered by the light emitting device layer 40, light emitted from the light emitting device layer 40 can emit through the storage capacitor 20, which improves the aperture ratio of the display panel.

In one embodiment, the storage capacitor 20 further comprises a third electrode 218.

It means that, when the second electrode 217 and the source/drain electrode layer 208 are disposed in a same level, the third electrode 218 and the gate electrode layer 206 are disposed in a same level. When the second electrode 217 and the pixel electrode layer 211 are disposed in a same level, the third electrode 218 and the gate electrode layer 206 are disposed in a same level, or the third electrode 218 and the source/drain electrode layer 208 are disposed in a same level.

Figure 8:
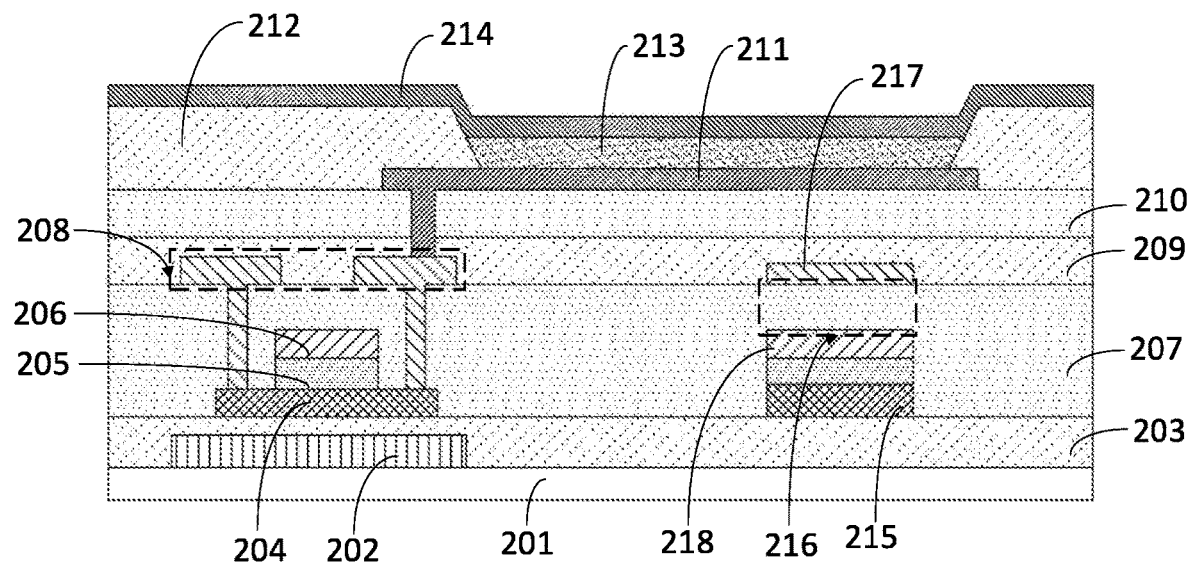
FIG. 8 is a structural diagram of another type of film layers of a display panel of the present disclosure.

As shown in FIG. 8, when the second electrode 217 and the source/drain electrode layer 208 are disposed in a same level, the third electrode 218 and the gate electrode layer 206 are disposed in a same level. Compared with FIG. 2 or FIG. 3, three parallel connected capacitors increase a total charge of the storage capacitor 20.

The present disclosure provides a display panel and a method of fabricating the same. The display panel has an array substrate having a substrate, a thin film transistor unit and a storage capacitor disposed on the substrate; a light emitting device layer disposed on the array substrate. An orthographic projection of the storage capacitor projected on the light emitting device layer is located within the light emitting device layer. In the present disclosure, a storage capacitor region of the array substrate is fabricated using a transparent metal material, and the light emitting device layer is disposed on the storage capacitor, so as to improve an aperture ratio of the display panel and improve a display effect of the display panel.

As described above, although the present disclosure has been described in preferred embodiments, they are not intended to limit the disclosure. One of ordinary skill in the art, without departing from the spirit and scope of the disclosure within, can make various modifications and variations, so the range of the scope of the disclosure is defined by the claims.

The invention claimed is:

1. A display panel, comprising:
an array substrate comprising:
a substrate; and
a thin film transistor unit and a storage capacitor disposed on the substrate,
wherein the storage capacitor comprises:
a first electrode disposed on the substrate;
a first insulating layer disposed on the first electrode; and
a second electrode disposed on the first insulating layer,
wherein the first electrode and the second electrode are made of a transparent metal material; and
wherein the thin film transistor unit comprises:
a light shielding layer disposed on the substrate;
a buffering layer disposed on the light shielding layer;
an active layer disposed on the buffering layer;
a gate insulating layer disposed on the active layer;
a gate electrode layer disposed on the gate insulating layer;
an insulating interlayer disposed on the gate electrode layer;
a source/drain electrode layer disposed on the insulating interlayer;
a passivation layer disposed on the source/drain electrode layer;
a planarization layer disposed on the passivation layer; and
a pixel electrode layer disposed on the planarization layer,
wherein the first electrode and the active layer are disposed in a same level;
wherein the first insulating layer and the insulating interlayer are disposed in a same level; and
wherein the second electrode and the source/drain electrode layer are formed in a same mask process, or the second electrode and the pixel electrode layer are formed in a same mask process; and
a light emitting device layer disposed on the array substrate,
wherein an orthographic projection of the storage capacitor projected on the light emitting device layer is located within the light emitting device layer.

2. The display panel according to claim 1, wherein the first insulating layer comprises $Al_2O_3$.

3. The display panel according to claim 1, wherein the storage capacitor further comprises a third electrode, and the third electrode is made of a transparent material, wherein:
when the second electrode and the source/drain electrode layer are disposed in a same level, the third electrode and the gate electrode layer are disposed in a same level; and
when the second electrode and the pixel electrode layer are disposed in a same level, the third electrode and the gate electrode layer are disposed in a same level, or the third electrode and the source/drain electrode layer are disposed in a same level.

4. A method of fabricating a display panel, comprising:
providing a substrate;
forming a thin film transistor unit and a storage capacitor on the substrate,
wherein the storage capacitor comprises:
a first electrode disposed on the substrate;
a first insulating layer disposed on the first electrode; and a second electrode disposed on the first insulating layer, wherein the first electrode and the second electrode are made of a transparent metal material; and wherein the thin film transistor unit comprises:
  a light shielding layer disposed on the substrate;
  a buffering layer disposed on the light shielding layer;
  an active layer disposed on the buffering layer;
  a gate insulating layer disposed on the active layer;
  a gate electrode layer disposed on the gate insulating layer;
  an insulating interlayer disposed on the gate electrode layer;
  a source/drain electrode layer disposed on the insulating interlayer;
  a passivation layer disposed on the source/drain electrode layer;
  a planarization layer disposed on the passivation layer; and
  a pixel electrode layer disposed on the planarization layer,
  wherein the first electrode and the active layer are disposed in a same level;
  wherein the first insulating layer and the insulating interlayer are disposed in a same level; and
  wherein the second electrode and the source/drain electrode layer are formed in a same mask process, or the second electrode and the pixel electrode layer are formed in a same mask process; and forming a light emitting device layer on the thin film transistor unit and the storage capacitor, wherein an orthographic projection of the storage capacitor projected on the light emitting device layer is located within the light emitting device layer.

5. The method of fabricating the display panel according to claim 4, wherein the first insulating layer comprises $Al_2O_3$.

6. The method of fabricating the display panel according to claim 4, wherein the storage capacitor further comprises a third electrode, and the third electrode is made of a transparent material, wherein:
  when the second electrode and the source/drain electrode layer are disposed in a same level, the third electrode and the gate electrode layer are disposed in a same level; and
  when the second electrode and the pixel electrode layer are disposed in a same level, the third electrode and the gate electrode layer are disposed in a same level, or the third electrode and the source/drain electrode layer are disposed in a same level.

* * * * *